(12) United States Patent
Furukawa et al.

(10) Patent No.: US 6,365,513 B1
(45) Date of Patent: Apr. 2, 2002

(54) METHOD OF MAKING A SEMICONDUCTOR DEVICE INCLUDING TESTING BEFORE THINNING THE SEMICONDUCTOR SUBSTRATE

(75) Inventors: Hidetoshi Furukawa; Atsushi Noma; Tsuyoshi Tanaka, all of Osaka; Hidetoshi Ishida, Kyoto; Daisuke Ueda, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/162,232

(22) Filed: Sep. 29, 1998

(30) Foreign Application Priority Data

Oct. 1, 1997 (JP) .............................. 9-268486
Jun. 30, 1998 (JP) ........................... 10-183765

(51) Int. Cl.[7] ..................... H01L 21/66; H01L 21/4763; H01L 21/44
(52) U.S. Cl. ......................... 438/667; 438/14; 438/17; 438/18; 438/142; 438/459; 438/606; 438/637; 438/639; 438/666
(58) Field of Search ................................ 438/606, 459, 438/637–640, 666–668, 10–12, 14, 17–18, 142, 197, 233

(56) References Cited

U.S. PATENT DOCUMENTS

| | | | | |
|---|---|---|---|---|
| 5,243,498 | A | | 9/1993 | Scofield ...................... 361/767 |
| 5,434,094 | A | * | 7/1995 | Kobiki et al. ................. 438/18 |
| 5,488,253 | A | | 1/1996 | Matsuoka ................... 257/622 |
| 5,646,067 | A | | 7/1997 | Gaul ........................... 438/458 |

FOREIGN PATENT DOCUMENTS

| | | |
|---|---|---|
| EP | 693778 | 1/1996 |
| JP | 6-5880 | 1/1994 |
| JP | 8-46042 | 2/1996 |

OTHER PUBLICATIONS

Guldan, et al., "Method for Producing Via–Connections in Semiconductor Wafers Using a Combination of Plasma and Chemical Etching," *IEEE Transactions on Electron Devices*, vol. Ed. 30, No. 10, Oct. 1983, pp. 1402–1403.

\* cited by examiner

*Primary Examiner*—Ha Tran Nguyen
(74) *Attorney, Agent, or Firm*—Eric J. Robinson; Nixon Peabody LLP

(57) ABSTRACT

A via hole having a bottom is formed in a substrate and then a conductor layer is formed at least over a sidewall of the via hole. Thereafter, the substrate is thinned by removing a portion of the substrate opposite to another portion of the substrate in which the via hole is formed such that the conductor layer is exposed.

2 Claims, 12 Drawing Sheets

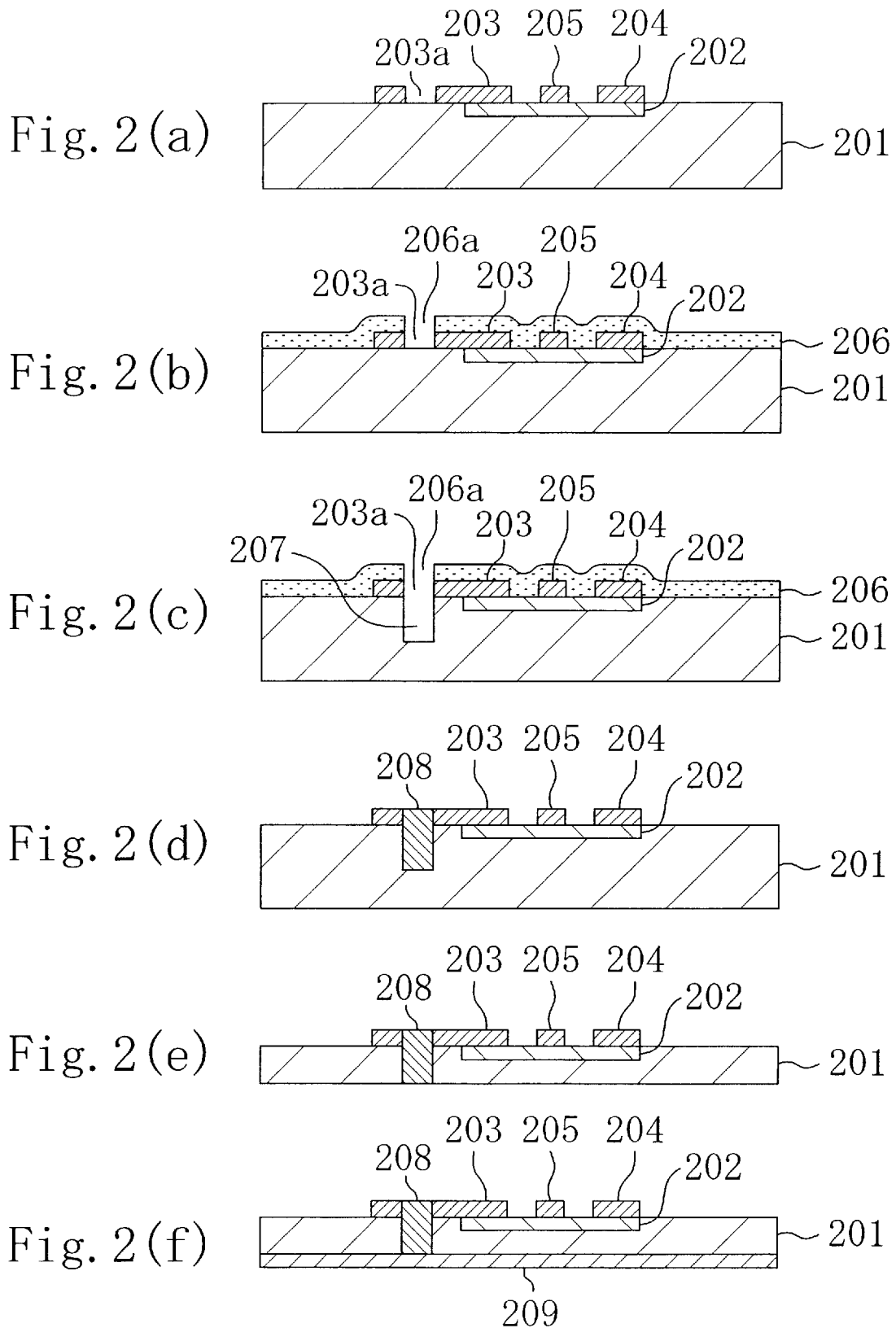

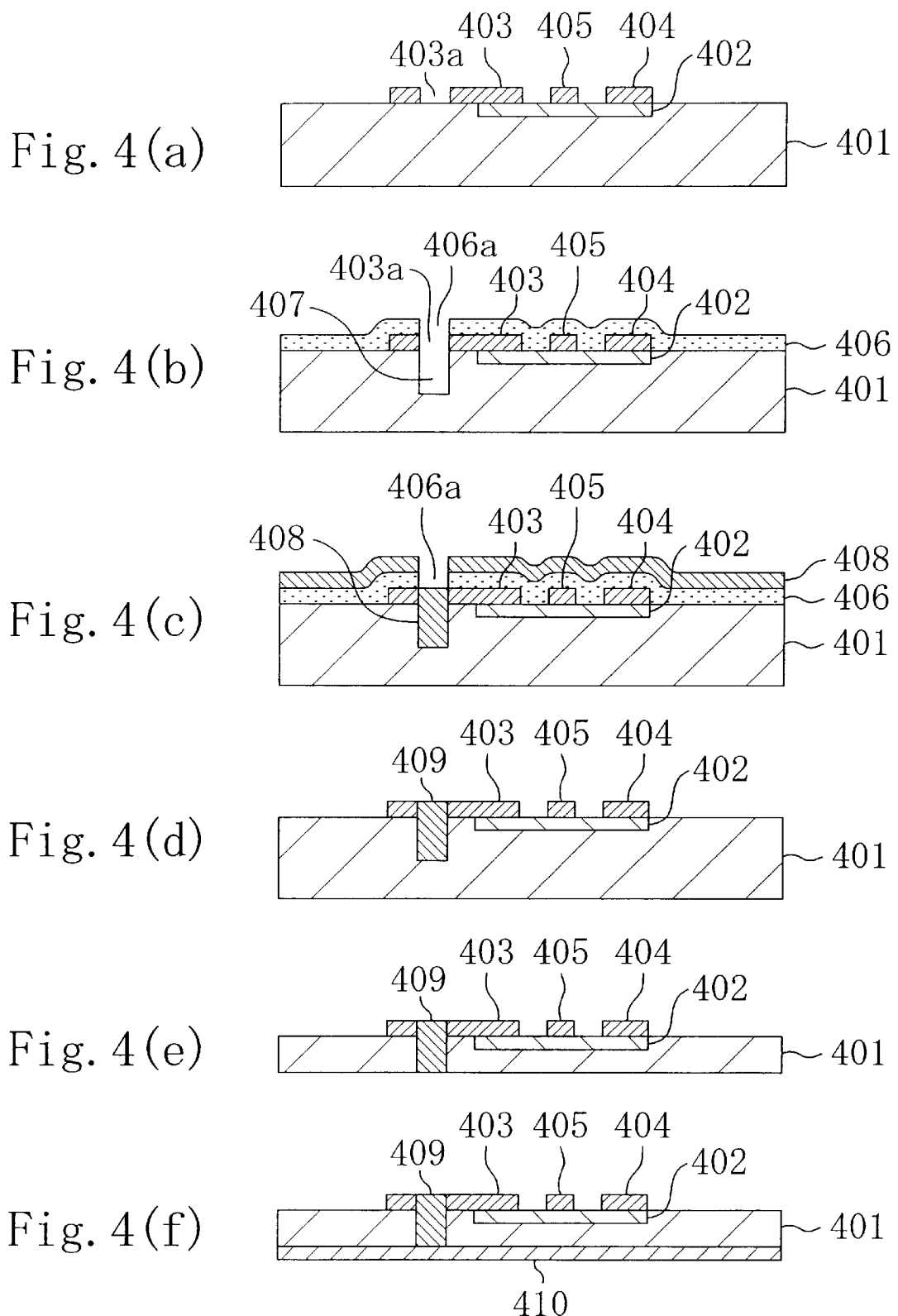

METHOD OF MAKING A SEMICONDUCTOR DEVICE INCLUDING TESTING BEFORE THINNING THE SEMICONDUCTOR SUBSTRATE

BACKGROUND OF THE INVENTION

The present invention relates to an electronic device used for a mobile communication unit or the like in the field of information/telecommunication technology and a method for fabricating the same.

In recent years, demand for various types of mobile communication units such as cellular phones and personal handy phone systems (PHS) has tremendously increased. In order to catch up with such rapidly increasing demand, the frequencies applied to these mobile communication units have exceeded the MHz bands to reach the GHz bands. In a frequency converter or a signal amplifier for the receiver or transmitter section of such a mobile communication unit, a gallium arsenide (GaAs) field effect transistor (FET), which can operate with high gain, low distortion and small current even in a high frequency region, is widely used.

A large number of GaAs FETs are formed on a semi-insulating substrate made of GaAs. Then, during mounting, the substrate is divided by dicing into respective chips. Each of the divided chips is mounted on a lead frame. Thereafter, the electrodes of each GaAs FET are electrically connected to the lead frame via an Au wire.

However, if an FET having such a structure is operated in a high frequency region, then the gain of the FET adversely decreases, because the Au wire contributes to the formation of parasitic inductance.

Thus, in order to solve this problem, a method for electrically connecting the electrodes of an FET formed on a GaAs substrate to a lead frame through a conductor layer filled in a via hole formed in the GaAs substrate is suggested in Japanese Laid-Open Publication No. 6-5880, for example. In accordance with this method, the distance between the electrodes of the FET and the lead frame to be connected thereto can be shortened compared with connecting the electrodes to the lead frame via an Au wire. As a result, the parasitic inductance can be considerably reduced and the decrease in gain of the FET can be prevented.

Hereinafter, a conventional method for fabricating an electronic device having a via hole as disclosed in Japanese Laid-Open Publication No. 6-5880 will be described with reference to FIGS. 12(a) through 12(d).

First, as shown in FIG. 12(a), an FET, including an active layer 12, a source electrode 13, a drain electrode 14 and a gate electrode 15, is formed on the principal surface of a substrate 11 made of GaAs and having a thickness of 600 $\mu$m. Then, as shown in FIG. 12(b), the back surface of the substrate 11 is polished to have the thickness thereof reduced to several tens to one hundred and several tens $\mu$m.

Next, as shown in FIG. 12(c), an etching mask 16 having an opening 16a at a site corresponding to the source electrode 13 is formed on the back surface of the substrate 11, and the substrate 11 is etched using this mask 16, thereby forming a via hole 17 in the substrate 11 so as to reach the back surface of the source electrode 13.

Subsequently, as shown in FIG. 12(d), the etching mask 16 is removed, and a plating undercoat layer 18 is formed over the entire back surface of the substrate 11 as well as the wall and bottom surfaces of the via hole 17. Then, a metal electrode 19 is formed over the plating undercoat layer 18 by electroplating technique such that the via hole 17 is filled in with the metal electrode 19. In this manner, an electronic device, which includes the substrate 11 with a reduced thickness and in which the source electrode 13 is electrically connected to the metal electrode 19, can be obtained. It is noted that the plating undercoat layer 18 improves the adhesion of the metal electrode 19 to the substrate 11.

However, in accordance with this conventional method for fabricating an electronic device, since the via hole 17 is formed by etching the thinned substrate 11 using the etching mask 16, the substrate 11 is likely to crack. The reason is as follows. In order to form the via hole 17, the thinned substrate 11 must be transported to an apparatus for forming the etching mask 16 and then to an apparatus for etching the substrate 11. That is to say, since the substrate 11, which has the mechanical strength thereof decreased because of the reduction in thickness thereof, should be transported to these apparatuses, the substrate 11 is more likely to crack during the transportation. Thus, in accordance with the conventional method for fabricating an electronic device, the production yield adversely decreases.

Also, in order to form the via hole 17 in the substrate 11, the etching mask 16 having the opening 16a at the site corresponding to the source electrode 13 should be formed over the back surface of the substrate 11. Accordingly, during this process step, the position of the source electrode 13 formed on the principal surface of the substrate 11 should be aligned with the position of the opening 16a of the etching mask 16 formed on the back surface of the substrate 11. However, in order to align the position of the source electrode 13 on the principal surface of the substrate 11 with the position of the opening 16a of the etching mask 16 on the back surface thereof, a special aligner must be used. In addition, the process step required is adversely complicated and difficult.

SUMMARY OF THE INVENTION

In view of the above-described problems, the objects of the present invention are to prevent a decrease in production yield because of cracking of a substrate during the transportation step for forming a via hole in the substrate, and to eliminate a complicated alignment step conventionally required for forming a via hole in the substrate.

In order to accomplish these objects, a first method for fabricating an electronic device according to the present invention includes the steps of: a) forming a via hole in the principal surface of a substrate, the via hole having a bottom; b) forming a conductor layer at least over a sidewall of the via hole; and c) thinning the substrate by removing a portion of the substrate such that the conductor layer is exposed, the portion of the substrate being opposite to another portion of the substrate in which the via hole is formed.

In accordance with the first method for fabricating an electronic device, a via hole having a bottom is formed in the principal surface of a substrate, a conductor layer is formed at least over a sidewall of the via hole, and then the substrate is thinned by removing a portion of the substrate opposite to another portion of the substrate in which the via hole is formed such that the conductor layer is exposed. Thus, the steps of forming the via hole in the substrate and forming the conductor layer in the via hole can be performed on a substrate that has not been thinned yet and thus still retains a sufficient mechanical strength. Accordingly, the step of transporting a thinned substrate to an apparatus for forming a via hole or to an apparatus for forming a conductor layer need not be performed. As a result, it is possible to prevent the substrate from cracking during the transportation of the substrate to these apparatuses and the production yield of the electronic device can be increased as compared with a conventional method.

In addition, no etching mask for forming a via hole needs to be formed over the back surface opposite to the principal surface of the substrate. Thus, a complicated alignment step using a special aligner, which has been required by a conventional method for aligning the position of an opening of the etching mask formed on the back surface of the substrate with the position of an electrode layer formed on the principal surface of the substrate, is no longer necessary.

In one embodiment of the present invention, the method preferably further includes, prior to the step a), the step of d) forming an electrode layer on the principal surface of the substrate, the electrode layer having a through hole over a region where the via hole is to be formed. The step a) preferably includes the steps of: forming an etching mask over the principal surface of the substrate as well as over the electrode layer, the etching mask having an opening over the region where the via hole is to be formed; and etching the substrate using the etching mask to form the via hole.

In such an embodiment, an electrode layer having a via hole is formed over a region where the via hole is to be formed, the via hole is formed by etching the substrate using an etching mask having an opening over the region where the via hole is to be formed, and then a conductor layer is formed at least over a sidewall of the via hole. Thus, an interconnection layer connecting the electrode layer to the conductor layer is no longer necessary. As a result, the number of required process steps can be reduced.

In another embodiment, the step b) preferably includes the step of filling in the via hole with the conductor layer. In such an embodiment, the electrode layer formed on the principal surface of the substrate can be connected to the conductor layer with more certainty.

In still another embodiment, the step b) preferably includes the step of forming the conductor layer by electron beam evaporation technique such that the conductor layer includes a sidewall portion and a bottom portion and has a recess at the center thereof. In such an embodiment, the conductor layer can be formed in a short period of time.

In this case, the step c) preferably includes the step of removing the portion of the substrate opposite to the portion of the substrate in which the via hole is formed such that the bottom portion of the conductor layer is left.

If the bottom portion of the conductor layer is left in this manner, then the contact area between an electrode layer formed on the back surface opposite to the principal surface of substrate and the conductor layer becomes large. As a result, contact resistance between the electrode layer on the back surface and the conductor layer can be reduced.

In still another embodiment, the step b) preferably includes the steps of forming a plating undercoat layer over the sidewall of the via hole and filling in the inside of the plating undercoat layer with the conductor layer.

In such an embodiment, a metal, which is usually hard to be directly plated over the substrate, can be used as a material for the conductor layer. Accordingly, it is possible to broaden the range from which a material for forming the conductor layer is selected.

In still another embodiment, the substrate is preferably a semi-insulating substrate made of a Group III–V compound such as gallium arsenide and indium phosphide.

In general, a semi-insulating substrate made of a Group III–V compound easily cracks by nature. In accordance with the first method for fabricating an electronic device, however, even when such an easily cracking semi-insulating substrate made of a Group III–V compound is used, the substrate can be thinned without making the substrate crack.

A second method for fabricating an electronic device according to the present invention includes the steps of: a) forming an electrode layer on the principal surface of a substrate; b) forming a first plating undercoat layer over the entire principal surface of the substrate; c) depositing an insulator film over the first plating undercoat layer, the insulator film having an opening over a region where a via hole is to be formed, a surrounding region thereof and at least part of the electrode layer; d) forming an etching mask over the first plating undercoat layer and the insulator film, the etching mask having an opening over the region where the via hole is to be formed; e) forming the via hole having a bottom through the first plating undercoat layer and in the substrate by etching the substrate using the etching mask; f) forming a second plating undercoat layer over the etching mask as well as over the inside of the via hole; g) leaving the second plating undercoat layer inside the via hole by lifting off the second plating undercoat layer and the etching mask; h) forming a metal layer to cover the opening of the insulator film as well as the inside of the via hole by plating the first and second plating undercoat layers with a metal using the insulator film as a mask; and i) thinning the substrate by removing a portion of the substrate opposite to another portion of the substrate in which the via hole is formed such that the metal layer is exposed.

In accordance with the second method for fabricating an electronic device, the steps of forming the via hole in the substrate and forming the conductor layer in the via hole can be performed on a substrate that has not been thinned yet and thus still retains a sufficient mechanical strength, as in the first method for fabricating an electronic device. Accordingly, the step of transporting a thinned substrate to an apparatus for forming a via hole or to an apparatus for forming a conductor layer need not be performed. As a result, it is possible to prevent the substrate from cracking during the transportation of the substrate to these apparatuses and the production yield of the electronic device can be increased as compared with a conventional method.

In addition, no etching mask for forming a via hole needs to be formed over the back surface opposite to the principal surface of the substrate. Thus, a complicated alignment step using a special aligner, which has been required by a conventional method for aligning the position of an opening of the etching mask formed on the back surface of the substrate with the position of an electrode layer formed on the principal surface of the substrate, is no longer necessary.

In particular, in accordance with the second method for fabricating an electronic device, metal plating is performed by using, as a mask, an insulator film having an opening over a region where a via hole is formed, a surrounding region thereof and at least part of the electrode layer, thereby forming a metal layer to cover the opening of the insulator film as well as the inside of the via hole. Thus, since the metal film connected to the electrode layer formed on the principal surface of the substrate reaches the region surrounding the region where the via hole is formed, the electrical characteristics of the electronic device can be tested by connecting a tester electrode to the metal film reaching the surrounding region. Accordingly, the electrical characteristics of the electronic device already including the via hole can be performed while the substrate has not been thinned yet and thus still retains a sufficient mechanical strength. Moreover, the substrate of an electronic device having defective electrical characteristics is not thinned in vain.

In one embodiment of the present invention, the step h) preferably includes the step of forming the metal layer in such a shape as including a sidewall portion and a bottom portion and has a recess at the center thereof. The step i) preferably includes the step of removing the portion of the substrate opposite to the portion of the substrate in which the via hole is formed such that the bottom portion of the metal layer is left.

In such an embodiment, the contact area between an electrode layer formed on the back surface opposite to the principal surface of the substrate and the conductor layer becomes large. As a result, contact resistance between the electrode layer on the back surface and the conductor layer can be reduced.

A first electronic device according to the present invention includes: an electrode layer formed on a substrate; a via hole formed in the vicinity of the electrode layer in the substrate; and a conductor layer formed at least over a sidewall of the via hole and electrically connected to the electrode layer. The via hole has a cross-sectional shape, at least part of which has an interior angle equal to or larger than 180 degrees.

In the first electronic device of the present invention, at least part of the cross section of the via hole has an interior angle equal to or larger than 180 degrees. Thus, the contact area between the conductor layer formed at least over the sidewall of the via hole and the substrate is larger. As a result, the adhesion between the conductor layer and the substrate increases and the conductor layer is less likely to peel off the substrate.

A second electronic device according to the present invention includes: an electrode layer formed on a substrate; a via hole formed in the vicinity of the electrode layer in the substrate; and a conductor layer formed at least over a sidewall of the via hole and electrically connected to the electrode layer. The conductor layer has an area with which a probe needle is able to make electrical contact.

In the second electronic device, the conductor layer has an area with which a probe needle is able to make electrical contact. Thus, the electrical characteristics of the electronic device can be tested by connecting a probe needle to an exposed part of the conductor layer on the back surface of the substrate. Since the electrical characteristics of the electronic device can be tested before a metal electrode is formed on the back surface of the substrate, the metal electrode is not formed in vain for an electronic device having defective electrical characteristics.

BRIEF DESCRIPTION OF THE DRAWINGS

FIGS. 2(a) through 2(f) are cross-sectional views illustrating the respective process steps for fabricating an electronic device in the second embodiment of the present invention.

FIGS. 4(a) through 4(f) are cross-sectional views illustrating the respective process steps for fabricating an electronic device in the fourth embodiment of the present invention.

DETAILED DESCRIPTION OF THE INVENTION

EMBODIMENT 1

Hereinafter, a method for fabricating an electronic device in the first embodiment of the present invention will be described with reference to FIGS. 1(a) through 1(f).

Figure 1A:
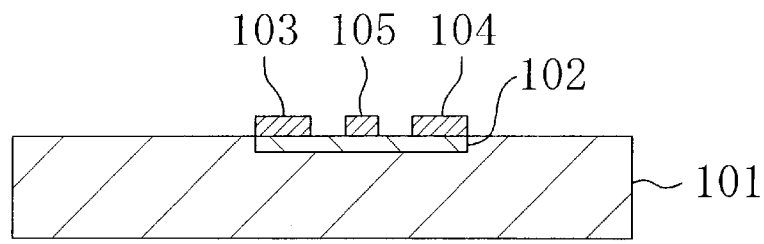
FIGS. 1(a) through 1(f) are cross-sectional views illustrating the respective process steps for fabricating an electronic device in the first embodiment of the present invention.

First, as shown in FIG. 1(a), arsenic ions are selectively implanted into the principal surface portion of a substrate 101 made of GaAs and having a thickness of 150 $\mu$m by using a resist mask. Then, heat treatment is conducted to activate the impurity, thereby forming an active layer 102 having a thickness of 0.2 $\mu$m. Thereafter, a first resist mask, having openings over respective regions where source/drain electrodes are to be formed, is formed over the active layer 102. Then, an alloy film of gold and germanium and a gold film are sequentially deposited over the first resist mask and the first resist mask is lifted off, thereby forming source/drain electrodes 103 and 104 to be in ohmic contact with the active layer 102. Also, a second resist mask, having an opening over a region where a gate electrode is to be formed, is formed over the active layer 102. Then, a titanium film having a thickness of 0.05 $\mu$m and an aluminum film having a thickness of 0.5 $\mu$m are sequentially deposited over the second resist mask and the second resist mask is lifted off, thereby forming a gate electrode 105 to be in Schottky contact with the active layer 102. In this manner, an FET including the active layer 102, the source electrode 103, the drain electrode 104 and the gate electrode 105 is obtained. It is noted that the gap between the source electrode 103 and the gate electrode 105 and the gap between the drain electrode 104 and the gate electrode 105 are both 1 $\mu$m.

Figure 1B:
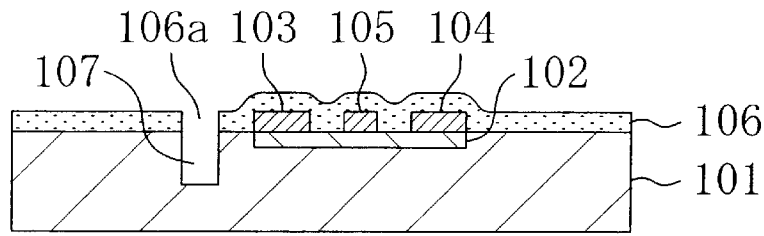

Next, as shown in FIG. 1(b), an etching mask 106 having an opening 106a over a region where a via hole is to be formed and having a thickness of 20 µm is formed over the principal surface of the substrate 101. Then, the substrate 101 is etched using the etching mask 106, thereby forming a via hole 107 having a depth of 200 µm and a bottom in the substrate 101. One side of the via hole 107 is 20 µm long.

Figure 1C:
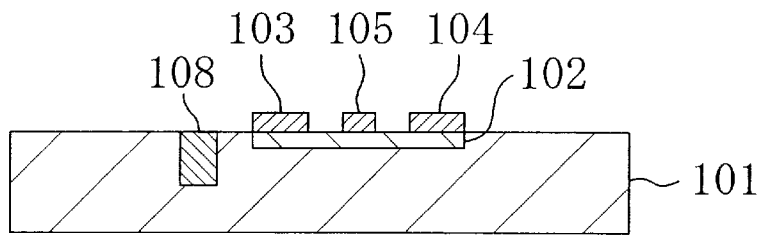

Subsequently, as shown in FIG. 1(c), a conductor layer 108, made of platinum, for example, is filled in the via hole 107 in accordance with electroless plating technique or the like and then the etching mask 106 is removed.

Figure 1D:
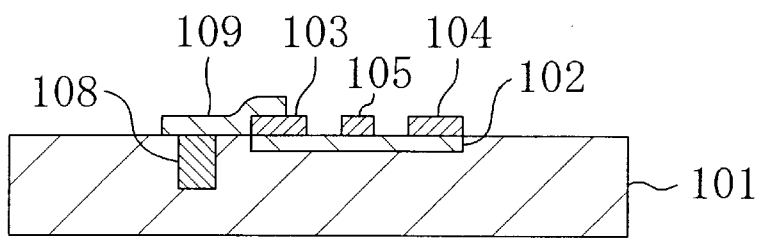

Then, as shown in FIG. 1(d), the source electrode 103 is connected to the conductor layer 108 in accordance with known lithography technique and an interconnection layer 109 made of gold and having a thickness of 0.5 µm is formed.

Figure 1E:
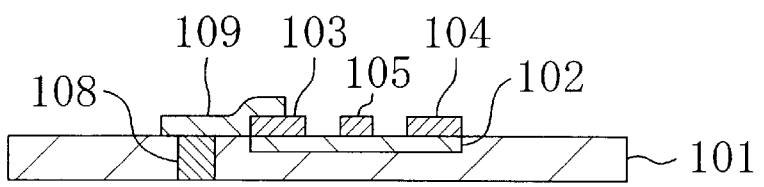

Thereafter, as shown in FIG. 1(e), the back surface portion of the substrate 101 (opposite to the portion where the via hole 107 is formed) is removed such that the conductor layer 108 is exposed, thereby thinning the substrate 101.

Figure 1F:
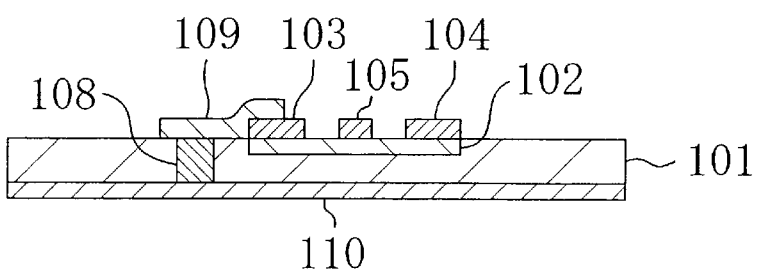

Finally, as shown in FIG. 1(f), a metal electrode 110, made of gold, is deposited over the entire back surface of the substrate 101. As a result, the interconnection layer 109 connected to the source electrode 103 is electrically connected to the metal electrode 110 by way of the conductor layer 108 filled in the via hole 107.

In the first embodiment, the steps of forming the via hole 107 in the substrate 101 and filling in the via hole 107 with the conductor layer 108 can be performed on the substrate 101 that has not been thinned yet and thus still retains a sufficient mechanical strength. Accordingly, it is possible to prevent the substrate from cracking while the substrate 101 thinned is transported to perform the steps of forming the via hole and the conductor layer. As a result, the production yield of the electronic device can be increased as compared with a conventional method.

In addition, no etching mask for forming the via hole 107 needs to be formed over the back surface of the substrate 101. Thus, a complicated alignment step using a special aligner, which has been required by a conventional method for aligning the position of an opening of an etching mask formed on the back surface of the substrate 101 with the position of the source electrode 103 formed on the principal surface of the substrate 101, is no longer necessary.

EMBODIMENT 2

Hereinafter, a method for fabricating an electronic device in the second embodiment of the present invention will be described with reference to FIGS. 2(a) through 2(f).

First, as shown in FIG. 2(a), arsenic ions are selectively implanted into the principal surface portion of a substrate 201 made of GaAs and having a thickness of 150 µm. Then, heat treatment is conducted to activate the impurity, thereby forming an active layer 202 having a thickness of 0.2 µm. Thereafter, source/drain electrodes 203 and 204 in ohmic contact with the active layer 202 and a gate electrode 205 in Schottky contact with the active layer 202 are formed in the same way as in the first embodiment. In this manner, an FET including the active layer 202, the source electrode 203, the drain electrode 204 and the gate electrode 205 is obtained.

In the second embodiment, the source electrode 203 is formed to extend in the direction away from the gate electrode 205 and has an opening 203a over a region where a via hole is to be formed, unlike the source electrode 103 of the first embodiment. One side of the opening 203a is 20 µm long.

Next, as shown in FIG. 2(b), an etching mask 206 having an opening 206a, which communicates with the opening 203a of the source electrode 203, and having a thickness of 20 µm is formed over the principal surface of the substrate 201.

Then, as shown in FIG. 2(c), the substrate 201 is etched using the etching mask 206, thereby forming a via hole 207 having a depth of 200 µm and a bottom and communicating with the opening 203a of the source electrode 203 in the substrate 201. One side of the via hole 207 is 20 µm long.

Subsequently, as shown in FIG. 2(d), a conductor layer 208, made of platinum, for example, is filled in the via hole 207 by electroless plating technique, and the etching mask 206 is removed.

Then, as shown in FIG. 2(e), the back surface portion of the substrate 201 (opposite to the portion where the via hole 207 is formed) is removed such that the conductor layer 208 is exposed, thereby thinning the substrate 201.

Finally, as shown in FIG. 2(f), a metal electrode 209, made of gold, is deposited over the entire back surface of the substrate 201. As a result, the source electrode 203 is electrically connected to the metal electrode 209 by way of the conductor layer 208 filled in the via hole 207.

In the second embodiment, the steps of forming the via hole 207 in the substrate 201 and filling in the via hole 207 with the conductor layer 208 can be performed on the substrate 201 that has not been thinned yet and thus still retains a sufficient mechanical strength. Accordingly, it is possible to prevent the substrate from cracking while the substrate 201 thinned is transported to perform the steps of forming the via hole and the conductor layer. As a result, the production yield of the electronic device can be increased as compared with a conventional method.

In addition, no etching mask for forming the via hole 207 needs to be formed over the back surface of the substrate 201. Thus, a complicated alignment step using a special aligner for aligning the position of an opening of an etching mask on the back surface with the position of the source electrode on the principal surface is no longer necessary.

Moreover, the source electrode 203 can be connected to the metal electrode 209 by filling in the opening 203a of the source electrode 203 and the via hole 207 with the conductor layer 208. Thus, in the second embodiment, the interconnection layer 109, which is required in the first embodiment for connecting the source electrode 103 to the conductor layer 108, is not necessary. Accordingly, the process can be simplified as compared with the first embodiment.

EMBODIMENT 3

Hereinafter, a method for fabricating an electronic device in the third embodiment of the present invention will be described with reference to FIGS. 3(a) through 3(f).

Figure 3A:
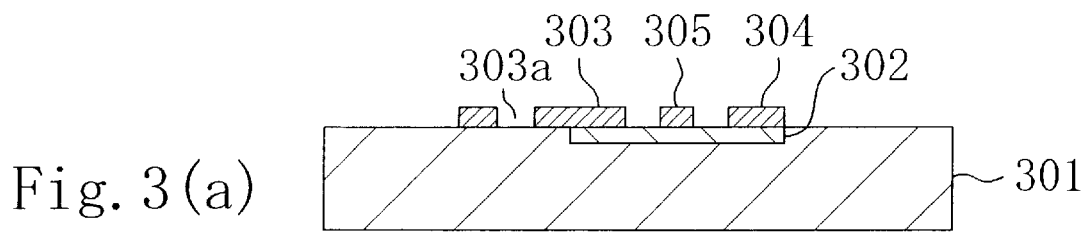
FIGS. 3(a) through 3(f) are cross-sectional views illustrating the respective process steps for fabricating an electronic device in the third embodiment of the present invention.

First, as shown in FIG. 3(a), arsenic ions are selectively implanted into the principal surface portion of a substrate 301 made of GaAs and having a thickness of 150 µm. Then, heat treatment is conducted to activate the impurity, thereby forming an active layer 302 having a thickness of 0.2 µm. Thereafter, source/drain electrodes 303 and 304 in ohmic contact with the active layer 302 and a gate electrode 305 in Schottky contact with the active layer 302 are formed in the same way as in the first embodiment. In this manner, an FET including the active layer 302, the source electrode 303, the drain electrode 304 and the gate electrode 305 is obtained.

In the third embodiment, the source electrode 303 is formed to extend in the direction away from the gate electrode 305 and has an opening 303a over a region where a via hole is to be formed, as in the second embodiment.

Figure 3B:
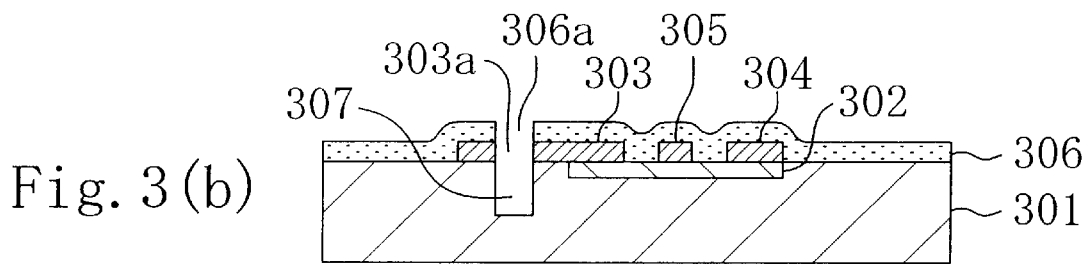

Next, as shown in FIG. 3(b), an etching mask 306 having an opening 306a, which communicates with the opening 303a of the source electrode 303, and having a thickness of 20 µm is formed over the principal surface of the substrate 301. Then, the substrate 301 is etched using the etching mask 306, thereby forming a via hole 307 having a depth of 200 μm and a bottom and communicating with the opening 303a of the source electrode 303 in the substrate 301. One side of the via hole 307 is 20 μm long.

Figure 3C:
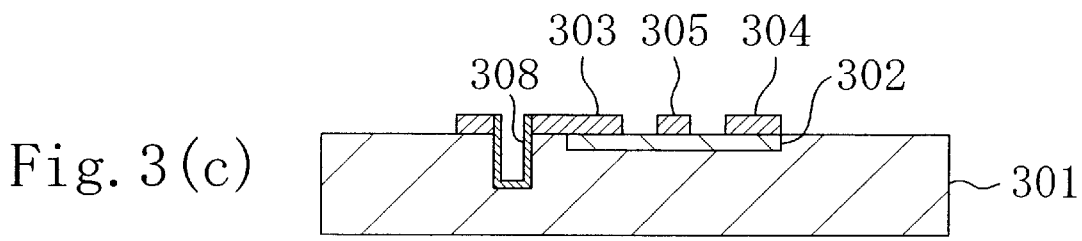

Then, as shown in FIG. 3(c), electron beams are irradiated at a tilt angle with the etching mask 306 left, thereby forming a plating undercoat layer 308, made of iridium and having a thickness of 10 nm, over the sidewalls and bottom of the via hole 307. Thereafter, the etching mask 306 is lifted off, thereby leaving the plating undercoat layer 308 only over the sidewalls and bottom of the via hole 307.

Figure 3D:
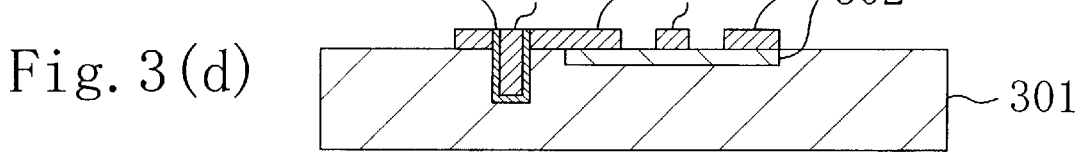

Subsequently, as shown in FIG. 3(d), a conductor layer 309, made of platinum, for example, is filled in the plating undercoat layer 308 by electroless plating technique.

Figure 3E:
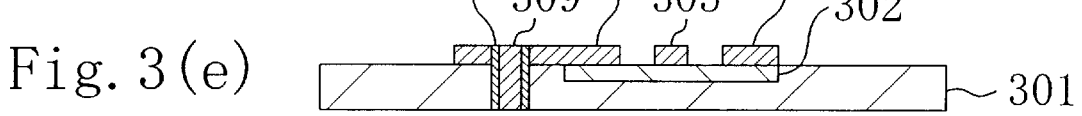

Then, as shown in FIG. 3(e), the back surface portion of the substrate 301 (opposite to the portion where the via hole 307 is formed) is removed such that the conductor layer 309 is exposed, thereby thinning the substrate 301.

Figure 3F:
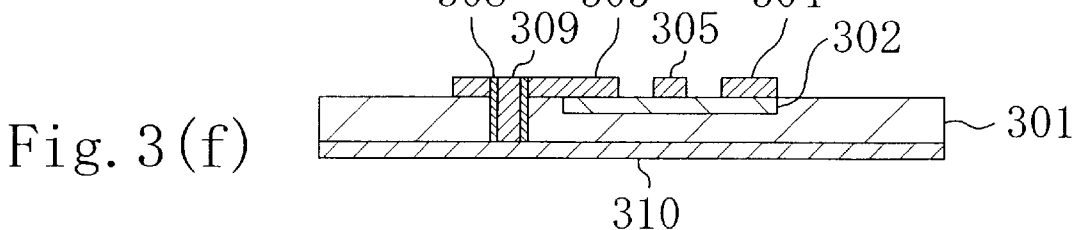

Finally, as shown in FIG. 3(f), a metal electrode 310, made of gold, is deposited over the entire back surface of the substrate 301. As a result, the source electrode 303 is electrically connected to the metal electrode 310 by way of the plating undercoat layer 308 and the conductor layer 309 formed in the via hole 307.

In the third embodiment, the steps of forming the via hole 307 in the substrate 301 and filling in the via hole 307 with the conductor layer 309 can be performed on the substrate 301 that has not been thinned yet and thus still retains a sufficient mechanical strength. Accordingly, it is possible to prevent the substrate from cracking while the substrate 301 thinned is transported to perform the steps of forming the via hole and the conductor layer. As a result, the production yield of the electronic device can be increased as compared with a conventional method.

In addition, no etching mask for forming the via hole 307 needs to be formed over the back surface of the substrate 301. Thus, a complicated alignment step using a special aligner for aligning the position of an opening of an etching mask on the back surface with the position of the interconnection layer on the principal surface is no longer necessary.

Moreover, the source electrode 303 can be connected to the metal electrode 310 by filling in the opening 303a of the source electrode 303 and the via hole 307 with the conductor layer 309. Thus, in the third embodiment, the interconnection layer 109, which is required in the first embodiment for connecting the source electrode 103 to the conductor layer 108, is not necessary. Accordingly, the process can be simplified as compared with the first embodiment.

Furthermore, the plating undercoat metal layer 308 is formed over the sidewalls and bottom of the via hole 307 and then the plating undercoat layer 308 is filled in with the conductor layer 309 by electroless plating technique. Thus, the conductor layer may be made of a metal (e.g., gold) that is usually hard to be directly plated over the substrate 301.

In the third embodiment, the conductor layer 309 is formed by electroless plating technique. Alternatively, the conductor layer 309 may be formed by any other plating technique or evaporation technique.

EMBODIMENT 4

Hereinafter, a method for fabricating an electronic device in the fourth embodiment of the present invention will be described with reference to FIGS. 4(a) through 4(f).

First, as shown in FIG. 4(a), arsenic ions are selectively implanted into the principal surface portion of a substrate 401 made of GaAs and having a thickness of 150 μm. Then, heat treatment is conducted to activate the impurity, thereby forming an active layer 402 having a thickness of 0.2 μm. Thereafter, source/drain electrodes 403 and 404 in ohmic contact with the active layer 402 and a gate electrode 405 in Schottky contact with the active layer 402 are formed in the same way as in the first embodiment. In this manner, an FET including the active layer 402, the source electrode 403, the drain electrode 404 and the gate electrode 405 is obtained.

In the fourth embodiment, the source electrode 403 is formed to extend in the direction away from the gate electrode 405 and has an opening 403a over a region where a via hole is to be formed, unlike the source electrode 103 of the first embodiment.

Next, as shown in FIG. 4(b), an etching mask 406 having an opening 406a, which communicates with the opening 403a of the source electrode 403, and having a thickness of 20 μm is formed over the principal surface of the substrate 401. Then, the substrate 401 is etched using the etching mask 406, thereby forming a via hole 407 having a depth of 200 μm and a bottom and communicating with the opening 403a of the source electrode 403 in the substrate 401. One side of the via hole 407 is 20 μm long.

Then, as shown in FIG. 4(c), a suspension, in which metal particles of platinum are turned into sol in the presence of an organic solvent, is applied over the entire surface of the substrate 401 as well as the inside of the via hole 407. Thereafter, the suspension is dried and the organic solvent is evaporated, thereby forming a metal particle layer 408 inside the via hole 407 and over the etching mask 406.

Then, as shown in FIG. 4(d), the etching mask 406 and a part of the metal particle layer 408 existing over the etching mask 406 are lifted off and removed. And the remaining part of the metal particle layer 408 is sintered by heating the substrate 401, thereby forming a conductor layer 409 out of the metal particle layer 408 inside the via hole 407.

Subsequently, as shown in FIG. 4(e), the back surface portion of the substrate 401 (opposite to the portion where the via hole 407 is formed) is removed such that the conductor layer 409 is exposed, thereby thinning the substrate 401.

Finally, as shown in FIG. 4(f), a metal electrode 410, made of gold, is deposited over the entire back surface of the substrate 401. As a result, the source electrode 403 is electrically connected to the metal electrode 410 by way of the conductor layer 409 filled in the via hole 407.

In the fourth embodiment, the steps of forming the via hole 407 in the substrate 401 and filling in the via hole 407 with the conductor layer 409 can be performed on the substrate 401 that has not been thinned yet and thus still retains a sufficient mechanical strength. Accordingly, it is possible to prevent the substrate from cracking while the substrate 401 thinned is transported to perform the steps of forming the via hole and the conductor layer. As a result, the production yield of the electronic device can be increased as compared with a conventional method.

In addition, no etching mask for forming the via hole 407 needs to be formed over the back surface of the substrate 401. Thus, a complicated alignment step using a special aligner for aligning the position of an opening of an etching mask on the back surface with the position of the interconnection layer on the principal surface is no longer necessary.

Moreover, the source electrode 403 can be connected to the metal electrode 410 by filling in the opening 403a of the source electrode 403 and the via hole 407 with the conductor layer 409. Thus, in the fourth embodiment, the interconnection layer 109, which is required in the first embodiment for connecting the source electrode 103 to the conductor layer 108, is not necessary. Accordingly, the process can be simplified as compared with the first embodiment.

Furthermore, in this embodiment, the metal particle layer 408 is formed by applying and then drying a suspension in which metal particles are turned into sol, and the conductor layer 409 is formed by sintering the metal particle layer 408. Thus, as compared with forming the conductor layer 409 by electroless plating technique, the conductor layer 409 can be formed in a shorter period of time and much more easily.

EMBODIMENT 5

Hereinafter, a method for fabricating an electronic device in the fifth embodiment of the present invention will be described with reference to FIGS. 5(a) through 5(f) and FIGS. 6(a) through 6(c).

Figure 5A:
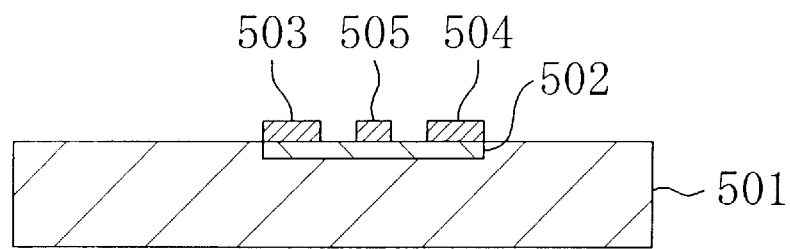
FIGS. 5(a) through 5(f) are cross-sectional views illustrating the respective process steps for fabricating an electronic device in the fifth embodiment of the present invention.

First, as shown in FIG. 5(a), arsenic ions are selectively implanted into the principal surface portion of a substrate 501 made of GaAs and having a thickness of 150 μm. Then, heat treatment is conducted to activate the impurity, thereby forming an active layer 502 having a thickness of 0.2 μm. Thereafter, source/drain electrodes 503 and 504 in ohmic contact with the active layer 502 and a gate electrode 505 in Schottky contact with the active layer 502 are formed in the same way as in the first embodiment. In this manner, an FET including the active layer 502, the source electrode 503, the drain electrode 504 and the gate electrode 505 is obtained.

Figure 5B:
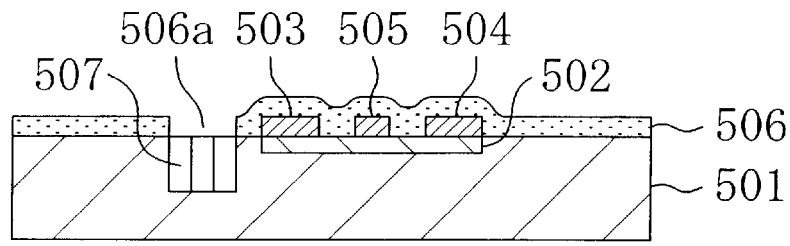
Figure 6A:
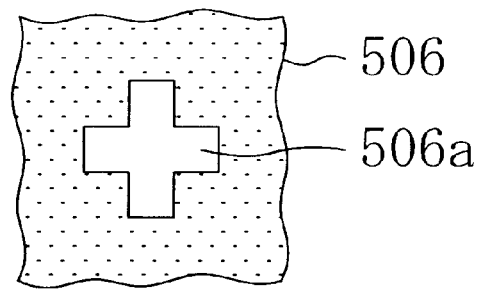
FIGS. 6(a) through 6(c) are plan views illustrating various types of etching masks usable for fabricating an electronic device in the fifth embodiment of the present invention.
Figure 6B:
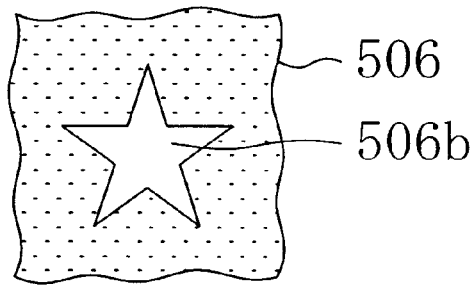
Figure 6C:
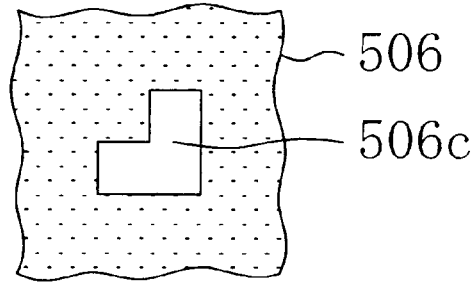

Next, as shown in FIG. 5(b), an etching mask 506, having a cross-shaped opening 506a such as that shown in FIG. 6(a) over a region where a via hole is to be formed and having a thickness of 20 μm, is formed over the principal surface of the substrate 501. One side of the cross-shaped opening 506a is 5 μm long. Then, the substrate 501 is etched using the etching mask 506, thereby forming a via hole 507 having a cross section in the shape of a cross, a depth of 200 μm and a bottom in the substrate 501. One side of the cross of the via hole 507 is 5 μm long.

Figure 5C:
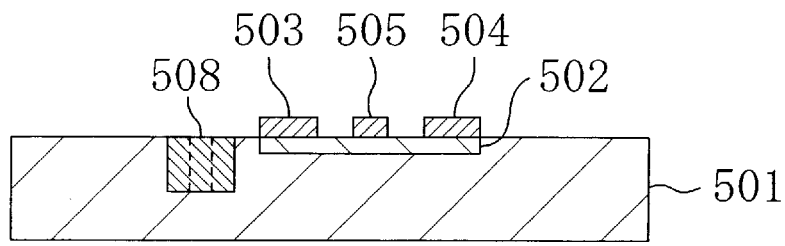

Subsequently, as shown in FIG. 5(c), a conductor layer 508, made of platinum, for example, is filled in the via hole 507 by electroless plating technique and then the etching mask 506 is removed.

Figure 5D:
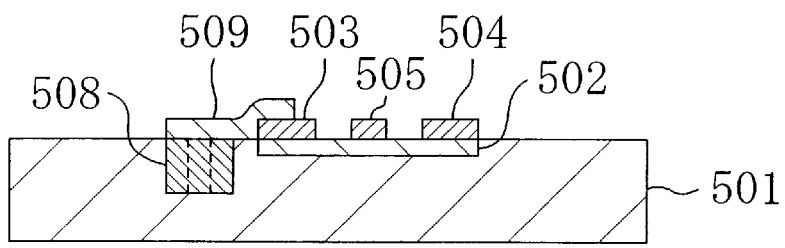

Then, as shown in FIG. 5(d), the source electrode 503 is connected to the conductor layer 508 in accordance with a known lithography technique and an interconnection layer 509 made of gold and having a thickness of 0.5 μm is formed.

Figure 5E:
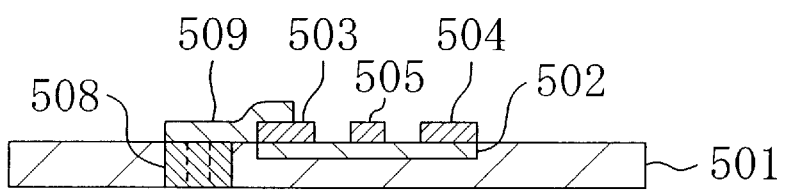

Thereafter, as shown in FIG. 5(e), the back surface portion of the substrate 501 (opposite to the portion where the via hole 507 is formed) is removed such that the conductor layer 508 is exposed, thereby thinning the substrate 501.

Figure 5F:
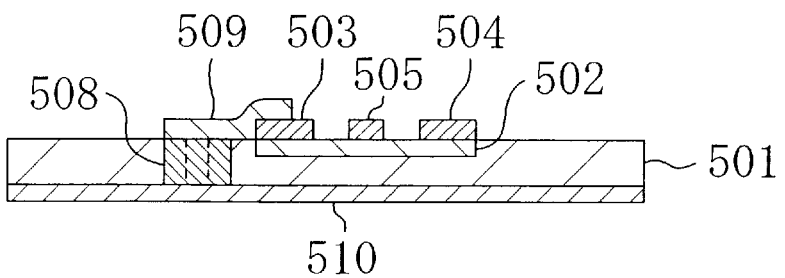

Finally, as shown in FIG. 5(f), a metal electrode 510, made of gold, is deposited over the entire back surface of the substrate 501. As a result, the interconnection layer 509 connected to the source electrode 503 is electrically connected to the metal electrode 510 by way of the conductor layer 508 filled in the via hole 507.

In the fifth embodiment, the steps of forming the via hole 507 in the substrate 501 and filling in the via hole 507 with the conductor layer 508 can be performed on the substrate 501 that has not been thinned yet and thus still retains a sufficient mechanical strength. Accordingly, it is possible to prevent the substrate from cracking while the substrate 501 thinned is transported to perform the steps of forming the via hole and the conductor layer. As a result, the production yield of the electronic device can be increased as compared with a conventional method.

In addition, no etching mask for forming the via hole 507 needs to be formed over the back surface of the substrate 501. Thus, a complicated alignment step using a special aligner for aligning the position of an opening of an etching mask on the back surface with the position of the interconnection layer on the principal surface, is no longer necessary.

Moreover, since the cross-section of the via hole 507 is in the shape of a cross, the surrounding area of the via hole 507 and the side area of the conductor layer 508 are larger as compared with the cases where the cross-sectional shape of the via hole 507 is square or circular. Thus, the contact area between the conductor layer 508 and the substrate 501 is larger. Accordingly, though the adhesion between the substrate 501 made of GaAs and the conductor layer 508 made of a metal is usually less satisfactory, the larger contact area between the conductor layer 508 and the substrate 501 increases the adhesion between the conductor layer 508 and the substrate 501, thereby making the conductor layer 508 less likely to peel off the substrate 501.

Also, since the cross-sectional area of the via hole 507 and thus the bottom area of the conductor layer 508 are larger, the electrical characteristics of the FET can be tested by connecting a tester electrode (e.g., a probe needle) to an exposed part of the conductor layer 508 on the back surface of the substrate 501. Accordingly, since the electrical characteristics of the electronic device, in which the conductor layer 508 has already been formed, can be tested before the metal electrode 510 is formed, the metal electrode 510 is not formed in vain for an electronic device having defective electrical characteristics.

The cross sectional shape of the opening 506a of the etching mask 506 for forming the via hole 507 does not have to be that of a cross. Alternatively, the opening 506a may be a star shape such as the opening 506b shown in FIG. 6(b) or an L shape such as the opening 506c shown in FIG. 6(c). That is to say, the via hole 507 may have any cross-sectional shape so long as at least one interior angle thereof is equal to or larger than 180 degrees.

Also, instead of forming the interconnection layer 509 connecting the source electrode 503 to the conductor layer 508, a cross-shaped opening may be formed in the source electrode 503 and then the conductor layer 508 may be filled in the opening of the source electrode 503 and the via hole 507 as in the second to fourth embodiments.

EMBODIMENT 6

Hereinafter, a method for fabricating an electronic device in the sixth embodiment of the present invention will be described with reference to FIGS. 7(a) through 7(f).

Figure 7A:
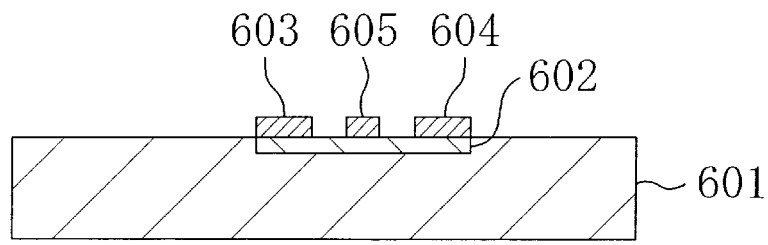
FIGS. 7(a) through 7(f) are cross-sectional views illustrating the respective process steps for fabricating an electronic device in the sixth embodiment of the present invention.

First, as shown in FIG. 7(a), arsenic ions are selectively implanted into the principal surface portion of a substrate 601 made of GaAs and having a thickness of 150 μm. Then, heat treatment is conducted to activate the impurity, thereby forming an active layer 602 having a thickness of 0.2 μm. Thereafter, source/drain electrodes 603 and 604 in ohmic contact with the active layer 602 and a gate electrode 605 in Schottky contact with the active layer 602 are formed in the same way as in the first embodiment. In this manner, an FET including the active layer 602, the source electrode 603, the drain electrode 604 and the gate electrode 605 is obtained.

Figure 7B:
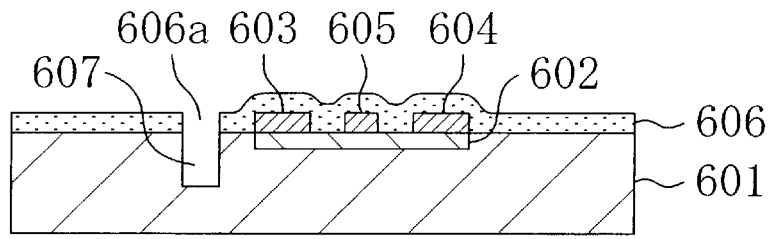

Next, as shown in FIG. 7(b), an etching mask 606 having an opening 606a over a region where a via hole is to be formed and having a thickness of 20 μm is formed over the principal surface of the substrate 601. Then, the substrate 601 is etched using the etching mask 606, thereby forming a via hole 607 having a depth of 200 μm and a bottom in the substrate 601.

Figure 7C:
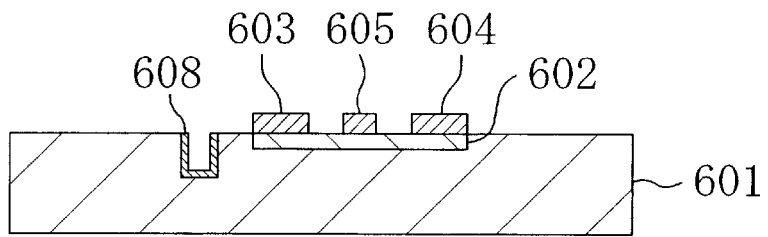

Then, as shown in FIG. 7(c), a cylindrical conductor layer 608 (having a bottom), made of platinum, for example, and having a thickness of 0.5 μm, is formed over the sidewall and bottom portions of the via hole 607 by electron beam evaporation technique. And the etching mask 606 is removed.

Figure 7D:
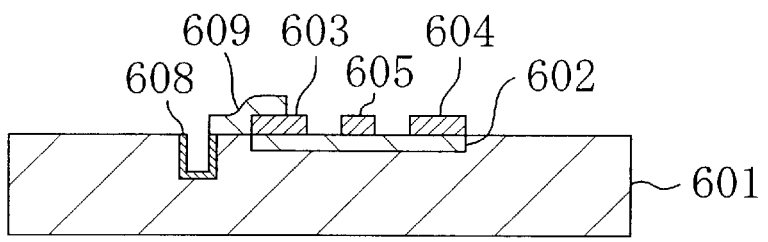

Thereafter, as shown in FIG. 7(d), the source electrode 603 is connected to the sidewall portion of the conductor layer 608 by a known lithography technique and an interconnection layer 609, made of gold and having a thickness of 0.5 μm, is formed.

Figure 7E:
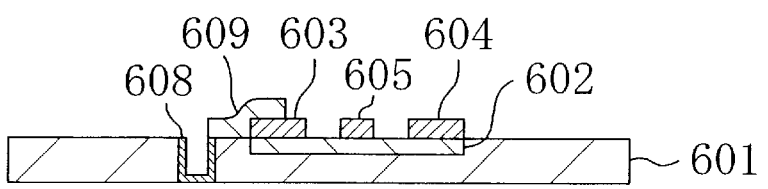

Then, as shown in FIG. 7(e), the back surface portion of the substrate 601 (opposite to the portion where the via hole 607 is formed) is removed such that the bottom portion of the conductor layer 608 is exposed, thereby thinning the substrate 601.

Figure 7F:
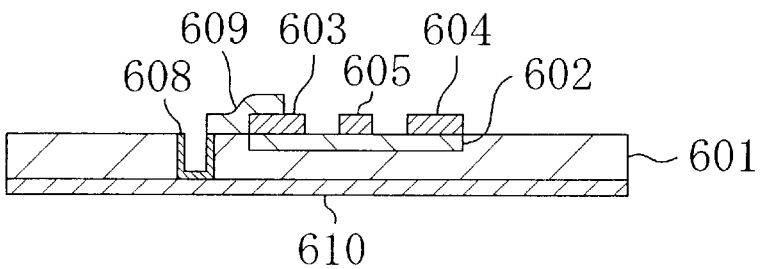

Finally, as shown in FIG. 7(f), a metal electrode 610, made of gold, is deposited over the entire back surface of the substrate 601. As a result, the interconnection layer 609 connected to the source electrode 603 is electrically connected to the metal electrode 610 by way of the conductor layer 608 formed in the via hole 607.

In the sixth embodiment, the steps of forming the via hole 607 in the substrate 601 and forming the conductor layer 608 in the via hole 607 can be performed on the substrate 601 that has not been thinned yet and thus still retains a sufficient mechanical strength. Accordingly, it is possible to prevent the substrate from cracking while the substrate 601 thinned is transported to perform the steps of forming the via hole and the conductor layer. As a result, the production yield of the electronic device can be increased as compared with a conventional method.

In addition, no etching mask for forming the via hole 607 needs to be formed over the back surface of the substrate 601. Thus, a complicated alignment step using a special aligner for aligning the position of an opening of an etching mask on the back surface with the position of the interconnection layer on the principal surface is no longer necessary.

Furthermore, in this embodiment, the conductor layer 608 is formed on the sidewall and bottom portions of the via hole 607 by electron beam evaporation technique. Thus, as compared with forming the conductor layer 608 by electroless plating technique, the conductor layer 608 can be formed in a shorter period of time and much more easily.

Moreover, the conductor layer 608 has a bottom and the conductor layer 608 and the metal electrode 610 are connected to each other via the bottom of the conductor layer 608. Accordingly, the contact resistance between the conductor layer 608 and the metal electrode 610 is reduced.

The conductor layer 608 formed inside the via hole 607 may be formed in the shape of a shallow column with a recessed portion near the surface thereof, not a cylinder having a bottom.

EMBODIMENT 7

Hereinafter, a method for fabricating an electronic device in the seventh embodiment of the present invention will be described with reference to FIGS. 8(a) through 8(e).

Figure 8A:
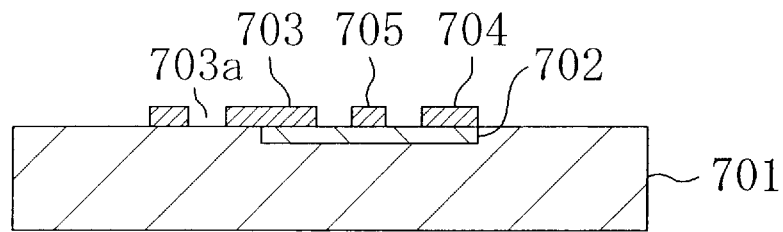
FIGS. 8(a) through 8(e) are cross-sectional views illustrating the respective process steps for fabricating an electronic device in the seventh embodiment of the present invention.

First, as shown in FIG. 8(a), arsenic ions are selectively implanted into the principal surface portion of a substrate 701 made of GaAs and having a thickness of 150 μm. Then, heat treatment is conducted to activate the impurity, thereby forming an active layer 702 having a thickness of 0.2 μm. Thereafter, source/drain electrodes 703 and 704 in ohmic contact with the active layer 702 and a gate electrode 705 in Schottky contact with the active layer 702 are formed in the same way as in the first embodiment. In this manner, an FET including the active layer 702, the source electrode 703, the drain electrode 704 and the gate electrode 705 is obtained.

In the seventh embodiment, the source electrode 703 is formed to extend in the direction away from the gate electrode 705 and has an opening 703a over a region where a via hole is to be formed, as in the second embodiment.

Figure 8B:
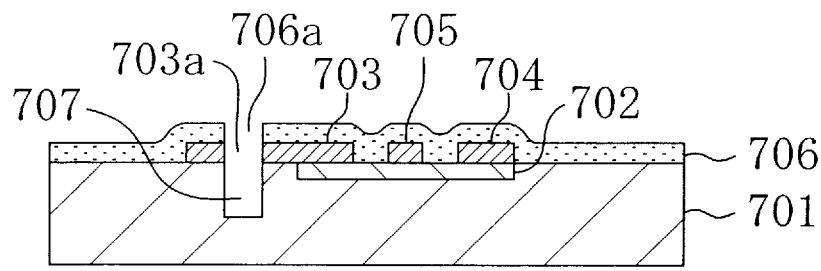

Next, as shown in FIG. 8(b), an etching mask 706 having an opening 706a, which communicates with the opening 703a of the source electrode 703, and having a thickness of 20 μm is formed over the principal surface of the substrate 701. Then, the substrate 701 is etched using the etching mask 706, thereby forming a via hole 707 having a depth of 200 μm and a bottom and communicating with the opening 703a of the source electrode 703 in the substrate 701. One side of the via hole 707 is 20 μm long.

Figure 8C:
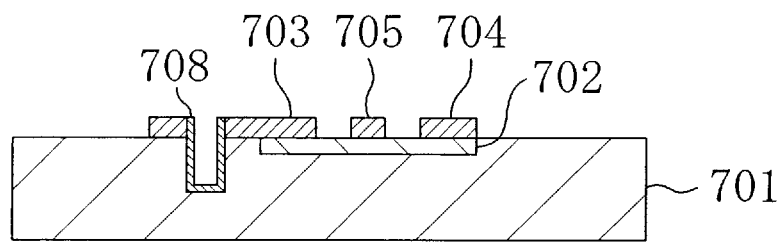

Then, as shown in FIG. 8(c), a conductor layer 708 having a thickness of 0.5 μm is formed over the sidewall and bottom portions of the via hole 707 by electron beam evaporation technique or plating technique. And the etching mask 706 is removed.

Figure 8D:
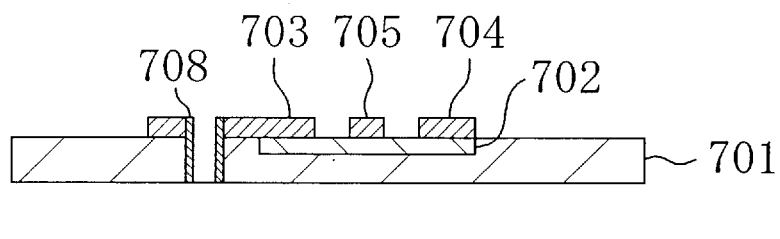

Subsequently, as shown in FIG. 8(d), the back surface portion of the substrate 701 (opposite to the portion where the via hole 707 is formed) is removed such that the bottom portion of the conductor layer 708 is removed and the sidewall portion thereof is exposed, thereby thinning the substrate 701.

Figure 8E:
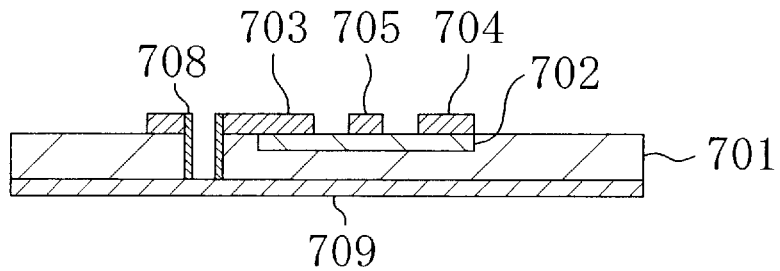

Finally, as shown in FIG. 8(e), a metal electrode 709, made of gold, is deposited over the entire back surface of the substrate 701. As a result, the source electrode 703 is electrically connected to the metal electrode 709 by way of the cylindrical conductor layer 708 formed in the via hole 707.

In the seventh embodiment, the steps of forming the via hole 707 in the substrate 701 and forming the conductor layer 708 in the via hole 707 can be performed on the substrate 701 that has not been thinned yet and thus still retains a sufficient mechanical strength. Accordingly, it is possible to prevent the substrate from cracking while the substrate 701 thinned is transported to perform the steps of forming the via hole and the conductor layer. As a result, the production yield of the electronic device can be increased as compared with a conventional method.

In addition, no etching mask for forming the via hole 707 needs to be formed over the back surface of the substrate 701. Thus, a complicated alignment step using a special aligner for aligning the position of an opening of an etching mask on the back surface with the position of the interconnection layer on the principal surface is no longer necessary.

Moreover, the source electrode 703 can be connected to the metal electrode 709 by forming the conductor layer 708 in the opening 703a of the source electrode 703 and in the via hole 707. Thus, in the third embodiment, the interconnection layer 109, which is required in the first embodiment for connecting the source electrode 103 to the conductor layer 108, is not necessary. Accordingly, the process can be simplified as compared with the first embodiment.

Furthermore, the conductor layer 708 is cylindrical and does not fill in the via hole 707. Thus, the time required to form the conductor layer 708 can be shortened.

EMBODIMENT 8

Hereinafter, a method for fabricating an electronic device in the eighth embodiment of the present invention will be described with reference to FIGS. 9(a) through 9(c), FIGS. 10(a) through 10(c) and FIGS. 11(a) and 11(b).

Figure 9A:
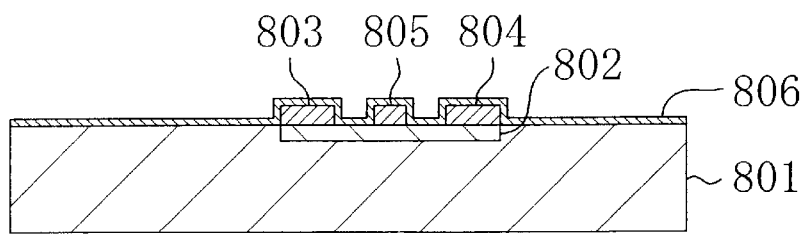
FIGS. 9(a) through 9(c) are cross-sectional views illustrating the first half of the process steps for fabricating an electronic device in the eighth embodiment of the present invention.

First, as shown in FIG. 9(a), arsenic ions are selectively implanted into the principal surface portion of a substrate 801 made of GaAs and having a thickness of 150 μm. Then, heat treatment is conducted to activate the impurity, thereby forming an active layer 802 having a thickness of 0.2 μm. Thereafter, source/drain electrodes 803 and 804 in ohmic contact with the active layer 802 and a gate electrode 805 in Schottky contact with the active layer 802 are formed in the same way as in the first embodiment. In this manner, an FET including the active layer 802, the source electrode 803, the drain electrode 804 and the gate electrode 805 is obtained. Then, a first plating undercoat layer 806 is formed over the entire surface of the substrate 801 by evaporation or sputtering technique.

Figure 9B:
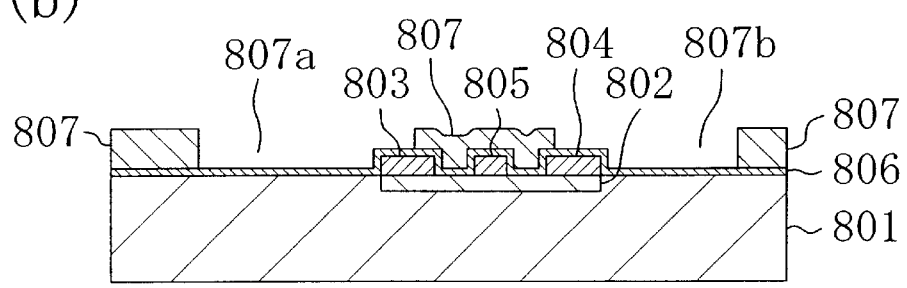

Next, as shown in FIG. 9(b), an insulator film 807 made of silicon dioxide (SiO$_2$) is deposited over the entire surface of the first plating undercoat layer 806. Thereafter, first and second openings 807a and 807b are formed in respective regions of the insulator film 807 where source-side and drain-side extended interconnections are to be formed. That is to say, these openings 807a and 807b are formed on the left hand side of the source electrode 803 opposite to the gate electrode 805 and on the right hand side of the drain electrode 804 opposite to the gate electrode 805, respectively.

Figure 9C:
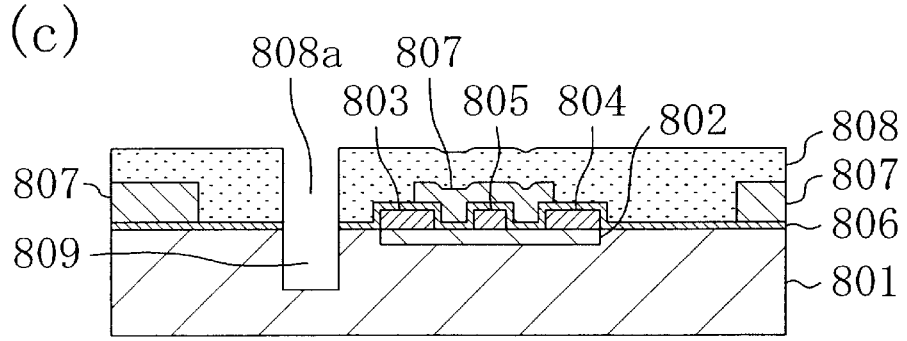

Next, as shown in FIG. 9(c), an etching mask 808, having an opening 808a over a region where a via hole is to be formed, is formed over the principal surface of the substrate 801 as well as over the insulator film 807. Then, the first plating undercoat layer 806 and the substrate 801 are etched using the etching mask 808, thereby forming a via hole 809 having a depth of 200 μm and a bottom in the substrate 801. One side of the via hole 809 is 20 μm long.

Figure 10A:
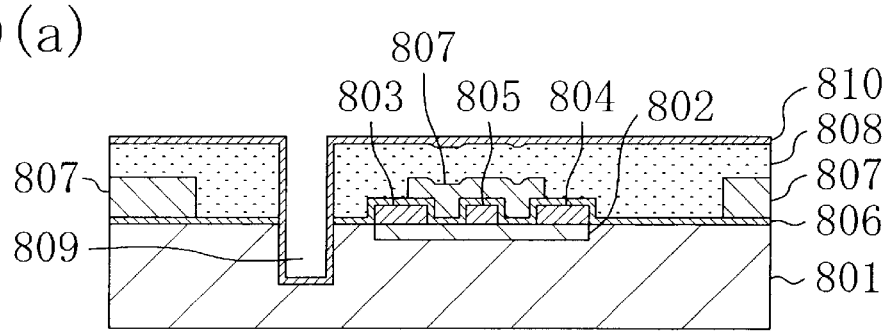
FIGS. 10(a) through 10(c) are cross-sectional views illustrating the second half of the process steps for fabricating an electronic device in the eighth embodiment of the present invention.

Subsequently, as shown in FIG. 10(a), a second plating undercoat layer 810 is formed by evaporation or sputtering technique over the entire surface of the etching mask 808 as well as the inside of the via hole 809.

Figure 10B:
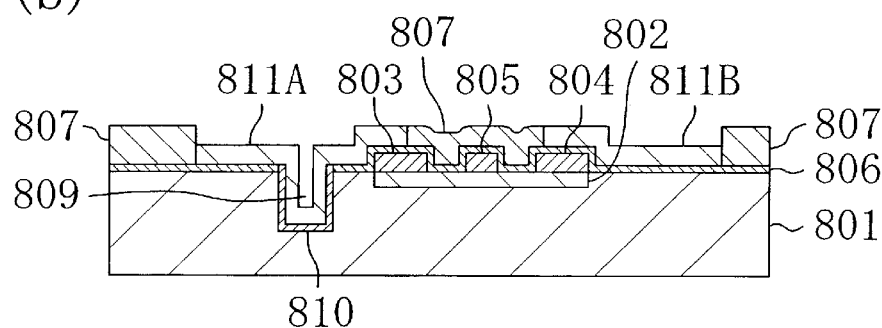

Thereafter, as shown in FIG. 10(b), the etching mask 808 is lifted off, thereby leaving the second plating undercoat layer 810 only on the wall and bottom portions of the via hole 809. Then, using the insulator film 807 as a masking member, a metal plating layer is formed over the first and second plating undercoat layers 806 and 810 as well as the inside of the via hole 809, thereby forming source-side and drain-side extended interconnections 811A and 811B out of the metal plating layer. In this case, the source-side extended interconnection 811A is formed over the sidewall and bottom portions of the via hole 809 and an upper surface region of the substrate 801, while the drain-side extended interconnection 811B is formed over another upper surface region of the substrate 801.

Figure 10C:
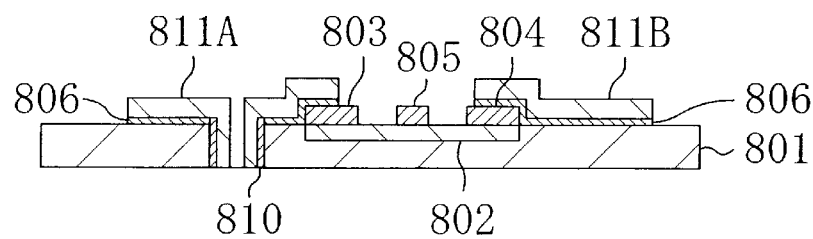

Next, as shown in FIG. 10(c), the back surface portion of the substrate 801 (opposite to the portion where the via hole 809 is formed) is removed such that the bottoms of the source-side extended interconnection 811A and the second plating undercoat layer 810 are removed and the sidewall portions of the interconnection 811A and the undercoat layer 810 are exposed, thereby thinning the substrate 801.

Figure 11A:
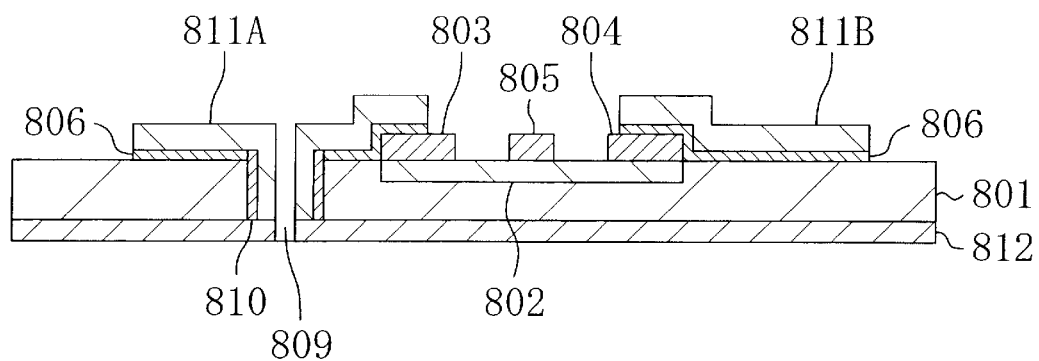
FIG. 11(a) is cross-sectional view of an electronic device formed in accordance with the method for fabricating an electronic device of the eighth embodiment.
Figure 11B:
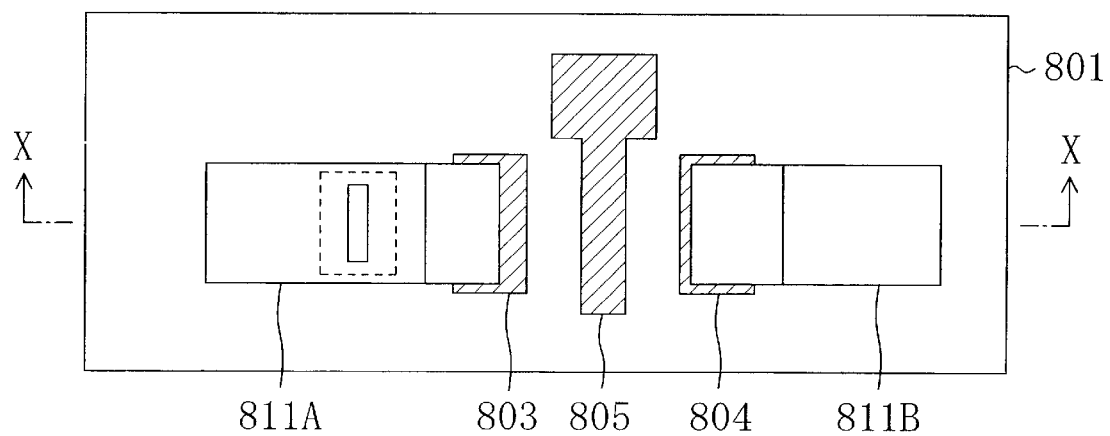
FIG. 11(b) is a plan view of the electronic device formed in accordance with the method for fabricating an electronic device of the eighth embodiment.
Figure 12A:
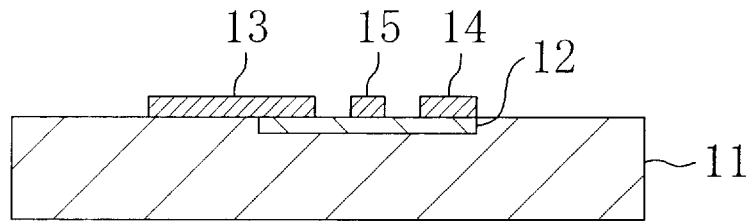
FIGS. 12(a) through 12(d) are cross-sectional view illustrating a conventional method for fabricating an electronic device.
Figure 12B:
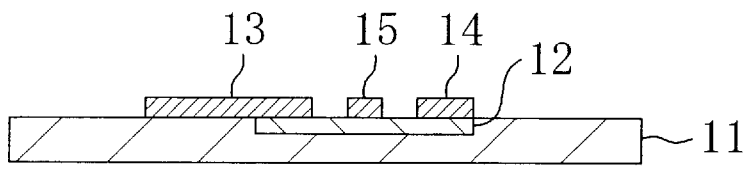
Figure 12C:
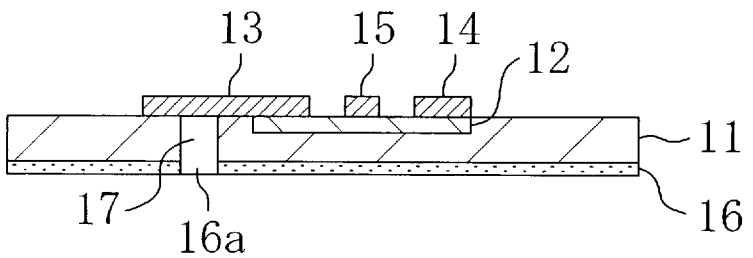
Figure 12D:
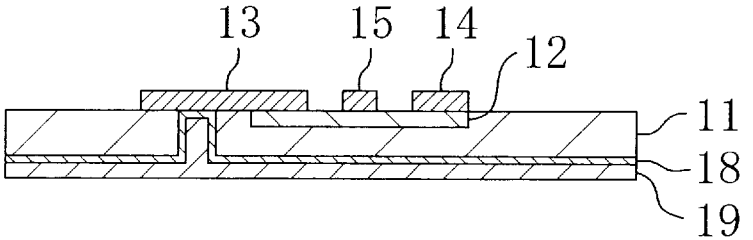

Finally, as shown in FIG. 11(a), a metal electrode 812, made of gold, is deposited over the entire back surface of the substrate 801. As a result, as shown in FIGS. 11(a) and 11(b), the source electrode 803 is electrically connected to the metal electrode 812 by way of the source-side extended interconnection 811A formed over the upper surface region of the substrate 801 and the inside of the via hole 809.

In the eighth embodiment, the steps of forming the via hole 809 in the substrate 801 and forming the source-side and drain-side extended interconnections 811A and 811B can be performed on the substrate 801 that has not been thinned yet and thus still retains a sufficient mechanical strength. Accordingly, it is possible to prevent the substrate 801 from cracking while the substrate 801 thinned is transported to perform the steps of forming the via hole and the interconnections. As a result, the production yield of the electronic device can be increased as compared with a conventional method.

In addition, no etching mask for forming the via hole 809 needs to be formed over the back surface of the substrate 801. Thus, a complicated alignment step using a special aligner for aligning the position of an opening of an etching mask on the back surface with the position of the interconnection layer on the principal surface is no longer necessary.

Moreover, the source-side and drain-side extended interconnections 811A and 811B are formed out of the metal plating layer by plating technique using the insulator film 807 as a masking member. Thus, the source-side extended interconnection 811A connecting the source electrode 803 to the metal electrode 812 and the drain-side extended interconnection 811B connected to the drain electrode 804 can be formed during a single plating process step. As a result, the number of required process steps can be considerably reduced.

Furthermore, since the source-side and drain-side extended interconnections 811A and 811B are formed on the principal surface of the substrate 801, the electrical characteristics of the FET can be tested by connecting a tester electrode to the respective parts of the source-side and drain-side extended interconnections 811A and 811B formed on the principal surface of the substrate 801. Accordingly, the electrical characteristics of the electronic device, in which the via hole 809 has already been formed, can be performed on the substrate 801 that has not been thinned yet and thus still retains a sufficient mechanical strength. Moreover, the substrate of an electronic device having defective electrical characteristics is not thinned in vain.

In the eighth embodiment, the source-side extended interconnection 811A is cylindrical inside the via hole 809. Alternatively, the interconnection 811A may fill in the via hole 809.

In the foregoing first to eighth embodiments, any appropriate material that is not eroded owing to etching, e.g., photoresist, may be used as a material for the etching mask.

The conductor layer connecting the source electrode formed on the principal surface of the substrate to the metal electrode formed on the back surface thereof may be made of a conductive metal oxide such as iridium oxide or a conductive metal nitride such as titanium nitride. Alternatively, the conductor layer may have a multilayer structure in which a plurality of layers made of these oxides and nitrides are stacked.

In the foregoing embodiments, the substrate is made of GaAs. Alternatively, the substrate may be a substrate made of any other Group III–V compound semiconductor such as indium phosphide (InP), a silicon substrate, an insulating substrate made of sapphire or the like, or an amorphous substrate such as a glass substrate. Also, a substrate including any other device such as a semiconductor laser device, not the FET, may be used.

The substrate may be thinned by polishing, etching or the like.

What is claimed is:

1. A method for fabricating an electronic device, comprising the steps of:

forming a field effect transistor (FET) on a first surface of a substrate;

forming a via hole through the first surface of the substrate;

forming a conductive layer over the first surface of the substrate and a side face of the via hole, the conductive layer including an extended interconnection in a region where the via hole is formed, for testing electrical characteristics of the FET, the extended interconnection being connected with a drain/source region of the FET;

testing electrical characteristics of the FET by using the extended interconnection; and thinning the substrate by removing a second surface portion of the substrate which is opposite to the first surface such that a portion of the conductive layer formed on the side face of the via hole exposes itself, wherein the step of testing electrical characteristics of the FET is performed prior to the step of thinning the substrate.

2. A method for fabricating an electronic device, comprising the steps of:

forming a first conductive layer on a first surface of a substrate;

forming an insulator film having a first opening, on the first conductive layer;

forming a resist film having a second opening in an inner portion of the first opening, on the first conductive layer and the insulator film;

forming a hole in the first conductive layer and the substrate using the second opening of the resist film;

depositing a second conductive layer on a wall and bottom of the hole, and on the resist film;

removing a portion of the second conductive layer deposited on the resist film by removing the resist film;

forming a third conductive layer over the first surface of the substrate and an inner portion of the hole, by selectively plating a region of the first conductive layer, which is uncovered by the insulator film and a region of the second conductive layer in the hole, the third conductive layer having an extended interconnection in a first region of the first surface where the hole is formed, for testing electrical characteristics of a device formed in a second region of the first surface; and thinning the substrate by removing a portion of a second surface of the substrate, which is opposite to the first surface to expose a portion of the third conductive layer formed on the inner portion of the hole.

* * * * *